United States Patent [19]
Feldman et al.

[11] Patent Number: 5,846,092
[45] Date of Patent: Dec. 8, 1998

[54] PLASTIC CASED IC CARD ADAPTER ASSEMBLY

[75] Inventors: Steven Feldman, Madison; Michael Bashkin, Solon, both of Ohio

[73] Assignee: Minnesota Mining and Manufacturing Company, St. Paul, Minn.

[21] Appl. No.: 906,325

[22] Filed: Aug. 5, 1997

[51] Int. Cl.[6] .................................................. H01R 9/09
[52] U.S. Cl. ....................... 439/76.1; 361/737; 439/946
[58] Field of Search ..................... 361/737; 439/76.1, 439/946

[56] References Cited

U.S. PATENT DOCUMENTS

| | | | |
|---|---|---|---|
| 4,531,176 | 7/1985 | Beecher, II | 361/424 |
| 5,017,767 | 5/1991 | Mizuno | 235/492 |
| 5,313,364 | 5/1994 | Omori et al. | 361/737 |
| 5,339,222 | 8/1994 | Simmons et al. | 361/818 |
| 5,414,253 | 5/1995 | Baudouin et al. | 235/492 |
| 5,430,618 | 7/1995 | Huang | 361/818 |
| 5,510,959 | 4/1996 | Derstine et al. | 361/816 |
| 5,541,448 | 7/1996 | Carpenter | 257/679 |
| 5,546,278 | 8/1996 | Bethurum | 361/737 |
| 5,547,397 | 8/1996 | Hirai | 439/607 |
| 5,548,483 | 8/1996 | Feldman | 361/737 |
| 5,548,485 | 8/1996 | Bethurum et al. | 361/737 |
| 5,574,628 | 11/1996 | Persia et al. | 361/737 |
| 5,600,543 | 2/1997 | Sanemitsu | 361/737 |
| 5,608,607 | 3/1997 | Dittmer | 361/686 |
| 5,617,297 | 4/1997 | Lo et al. | 361/737 |
| 5,617,627 | 4/1997 | Semple et al. | 29/509 |

FOREIGN PATENT DOCUMENTS

| | | | |
|---|---|---|---|
| 0 417 648 A2 | 6/1990 | European Pat. Off. . | |
| 0 697 806 A1 | 2/1996 | European Pat. Off. | H05K 5/02 |
| 5-201184 | 8/1993 | Japan | B42D 15/10 |

*Primary Examiner*—Neil Abrams
*Assistant Examiner*—Barry M. L. Standig
*Attorney, Agent, or Firm*—Matthew B. McNutt

[57] ABSTRACT

An IC card adapter includes a printed circuit board attached on a first edge to solder tails extending from a first connector and on an opposing second edge to solder tails extending from a second connector. The printed circuit board, first connector and second connector form a subassembly. The subassembly is provided with a first keyed interlock surface which mates with a second keyed interlock surface on a lower molded housing adapted to receive the subassembly. The first and second keyed interlock surfaces orient the subassembly and lower housing. The lower molded housing also includes a first latching member which snap-fits with a second latching member on an upper molded housing. When the lower and upper housings are engaged, they define a cavity which encloses the printed circuit board.

28 Claims, 7 Drawing Sheets

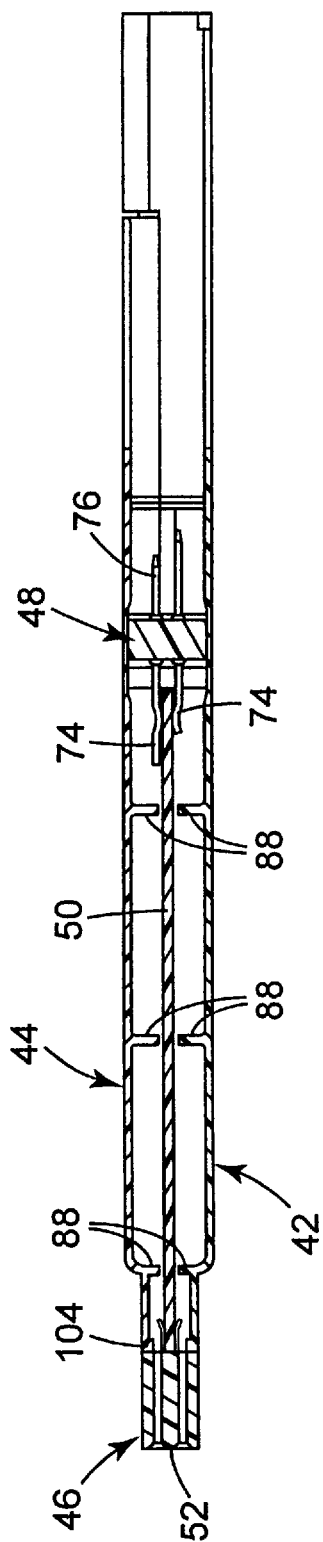
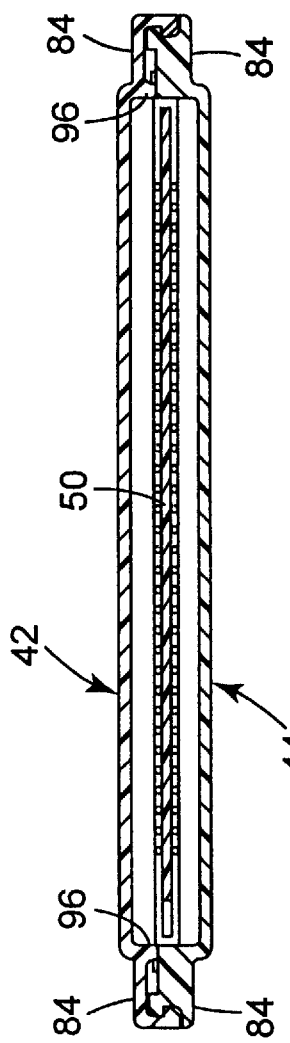

PLASTIC CASED IC CARD ADAPTER ASSEMBLY

BACKGROUND OF THE INVENTION

The present invention relates generally to IC (integrated circuit) card assemblies and more particularly to an improved adapter card assembly, such as for CF (CompactFlash) and PCMCIA (Personal Computer Memory Card International Association) card assemblies.

Small, lightweight and transportable computing devices are becoming ubiquitous. Such devices have a wide variety of functions, and it is often desired by the user to be able to adapt the function of the computing device to serve varying needs. To accommodate the ability of a user to alter the capabilities of a computing devices many of today's personal computers, computer peripherals and other electronic products such as digital cameras, have receptacles or ports for receiving removable IC cards. Such IC cards augment or replace traditional immovable memory, mass storage and input/output devices with removable cards that contain one or more integrated circuits. The IC cards may feature on-card functions, or may provide interfaces to other external devices. Because they are removable, IC cards let the user expand the memory, storage, communications and other capabilities of a computer or other electronic device without opening the case of the device.

IC cards typically conform to software and hardware specifications, including form factor standards which cover physical dimensions, pin assignments, and so on. A popular standard is that established by the Personal Computer Memory Card International Association (PCMCIA). Another standard with growing popularity is the Compact-Flash (CF) standard. As advances have been made which permit smaller and more compact IC cards, new standards for IC cards have been introduced to the market.

Most electronic devices are capable of receiving IC cards of just one standard. For example, an older device may be able to receive only a PCMCIA card, while a newer device may be able to receive only a CF card. Obviously, this presents many compatibility difficulties. A user may own several devices which require different IC card standards, and thus will not be able to interchange a single IC card among all of the devices. A user may replace an older device that uses one standard with a newer device that uses a different standard, thereby rendering the IC cards for the older device useless with the new device. As a result of these types of compatibility problems, adapters have been developed which allow an IC card of one standard to be used with a device which requires a card of another standard.

Currently available IC card adapters are not without problems of their own. In particular, currently available adapters use materials and assembly techniques common to IC cards, and as a result have the same types of problems as IC cards. For example, the adapter connectors usually nest in plastic frames which are then joined to metal covers by complicated manufacturing steps such as insert molding, ultrasonic welding, or thermoset adhesive, used alone or in combination. Usually, the connector bodies are bonded with adhesive to the metal covers to prevent the metal covers from flexing excessively and separating from the connector. However, under the stress of mechanical or thermal shock, vibration or flexure, present adapter assemblies can fail. Common modes of failure include fracturing of ultrasonic welds and adhesive separation.

Of course, it is readily apparent that each manufacturing step adds cost to the assembly. In IC cards, the material and assembly costs are low compared to the cost of the electronic components used in the IC card. However, the same is not true of adapter cards which contain few or no electronic devices other than connectors. Therefore, an adapter design utilizing less expensive components and simplifying the required assembly will provide a disproportionately large cost savings.

In addition to the complicated assembly requirements of currently available IC card adapters, the metal covers currently used in such adapters create a host of problems. Metal covers on the adapters increase the incidence of host equipment damage and program execution errors associated with ESD (electrostatic discharge) through the metal covers. It is also known that EMI (electromagnetic interference) emissions from the assembly occur when the metal covers act as an antenna. Another limitation attributed to metal covers is that they can cause wearing or skiving of a host connector due to the typically sharp edges of the covers. When this occurs, insulative debris are produced which can interfere with electrical contact interfaces in the connectors.

Unfortunately, a suitable solution to the problems associated with IC card adapter assemblies related to complicated assembly of excessive parts, bonding or welding requirements, electrostatic discharge, electromagnetic interference damage to host connectors and resulting debris, fracturing and separation failures and disassembly damage has not been satisfactorily addressed by the prior art.

Therefore, what is needed is an adapter apparatus for facilitating IC card adapter assembly. It is also highly desirable to provide added structural integrity to limit failures and shortcomings associated with the use of such adapter assemblies.

SUMMARY OF THE INVENTION

The present invention provides an apparatus and method of assembly of an IC card adapter. The apparatus comprises a printed circuit board having a first edge attached to solder tails extending from a back surface of a first connector and an opposing second edge attached to solder tails extending from a front surface of a second connector. The printed circuit board, first connector and second connector form a subassembly which is provided with a first keyed interlock surface. A lower molded housing is adapted to receive the subassembly. The lower housing includes a second keyed interlock surface for oriented engagement with the first keyed interlock surface of the subassembly. The keyed interlock surfaces of the subassembly and lower housing provide proper orientation between the subassembly and the lower housing, and also secure the subassembly within the lower housing. The lower housing also includes a first latching member. An upper molded housing is provided with a second latching member adapted for engagement with the first latching member of the lower housing, such that when engaged, the lower and upper housings define a cavity enclosing the printed circuit board.

The primary advantage of the present invention is that it provides lower manufacturing and assembly costs by reducing the number of components in the apparatus and reducing number of operations required to assemble the apparatus. The invention also provides improved electrical performance, and improved resistance to mechanical failure.

BRIEF DESCRIPTION OF THE DRAWINGS

FIG. 4b is an isolated view of the lower housing shown in FIG. 4a.

FIG. 8 is a cross sectional view taken along line 8—8 of FIG. 3.

FIG. 9 is a cross sectional view taken along line 9—9 of FIG. 3.

DETAILED DESCRIPTION OF THE INVENTION

Figure 1:
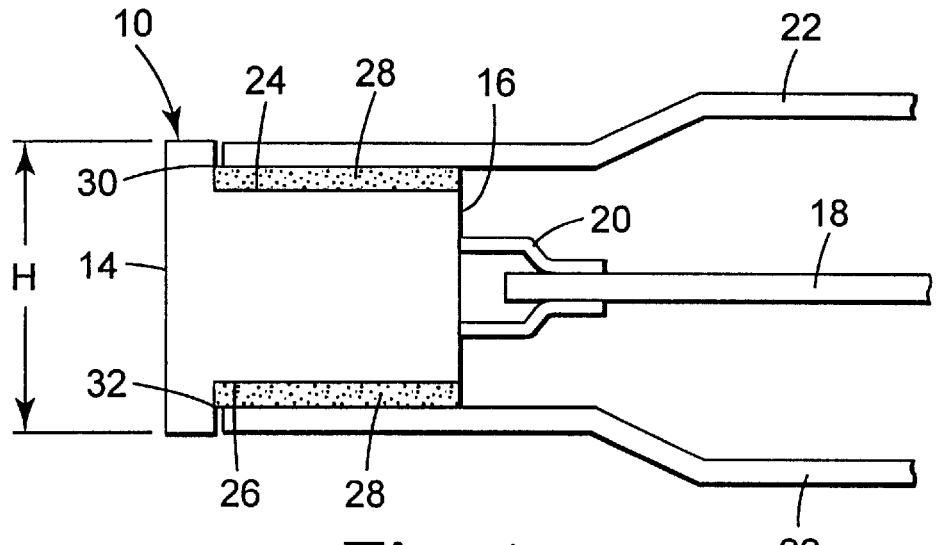
FIG. 1 is a cross sectional view of a prior art IC card adapter assembly.
Figure 2:
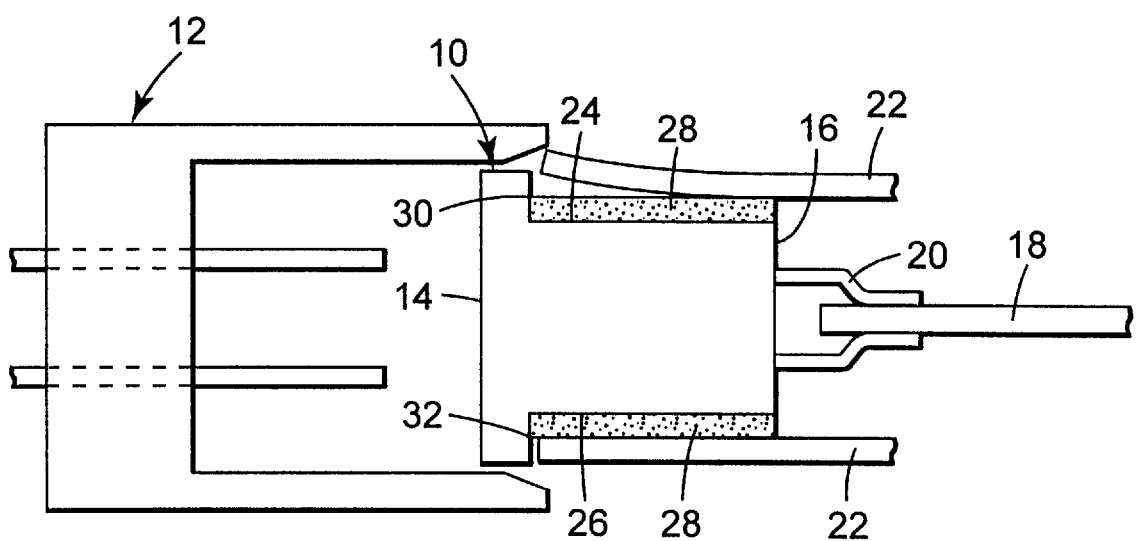
FIG. 2 illustrates a common failure mode of the IC card adapter assembly of FIG. 1.

A portion of a common prior art construction for IC card and IC card adapter assemblies is shown in FIGS. 1 and 2. FIGS. 1 and 2 show connector 10, well known in the art, for connection to an external host connector 12 (shown in FIG. 2). Front surface 14 of connector 10 includes a plurality of pin receiving connections (not shown) for connection to external host connector 12. Rear surface 16 of connector 10 is electrically connected to a circuit board 18 by contacts 20. Circuit board 18 is protected by metal covers 22 which are secured to upper and lower surfaces 24, 26 of connector 10 by an adhesive 28. The height H of connector 10 is controlled by form factor standards (e.g., PCMCIA and CF), and is 0.130 inches. Upper and lower surfaces 24, 26 include reduced thickness portions 30, 32, which reduce the thickness of connector 10 to approximately 0.106 inches, which is the practical minimum thickness due to the required connector body wall thickness. The remaining space (0.024 inches) is all that remains to accommodate the thickness of covers 22 and adhesive 28, such that the completed assembly has a smooth and continuous outer surface. Metal covers 22 usually have a thickness of about 0.008 inches, while adhesive 28 is about 0.004 inches thick. The objective of adhesively bonding metal covers 22 to connector 10 is to avoid bowing or lifting of covers 22 which would cause skiving or stubbing on pin header shroud 34 of external host connector 12, as is illustrated in FIG. 2. Such bowing or lifting can be caused by numerous factors, including mechanical and thermal shock, and poor adhesive bonding.

As discussed above, there are a host of disadvantages associated with metal covers. As a result, there have been attempts to substitute molded plastic covers for the metal covers of FIGS. 1 and 2, and thereby overcome many of the disadvantages of metal covers. However, such attempts have not been entirely successful. As noted above, the height H of connectors is limited by the appropriate standard (e.g., PCMCIA and CF), and it has proven extremely difficult to successfully mold a plastic cover which is thin enough (approximately 0.008 inches) to work with the construction shown in FIGS. 1 and 2. Accordingly, a novel and inventive construction is required.

Figure 3:
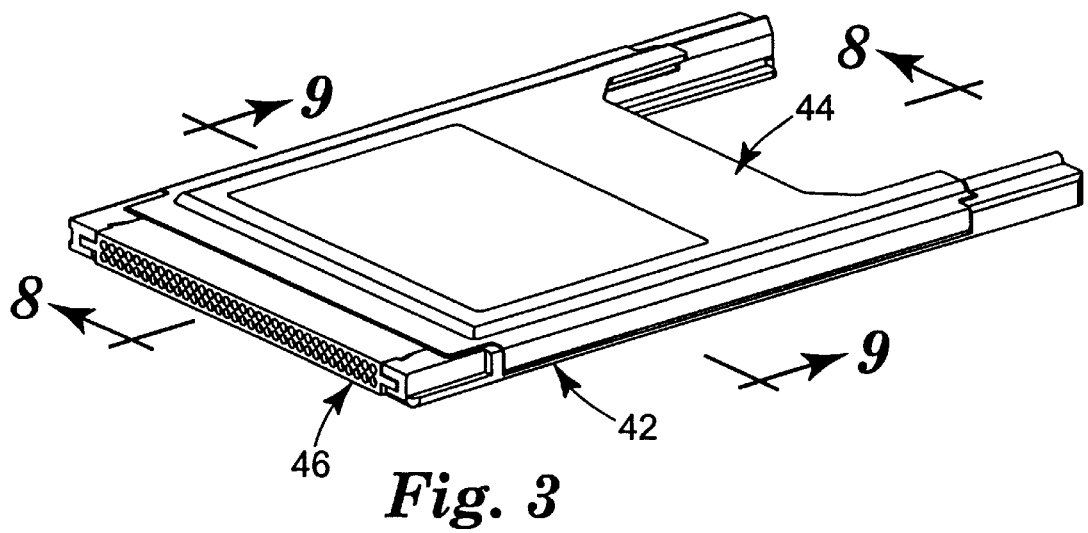
FIG. 3 is an isometric view of the inventive IC card adapter assembly.
Figure 4A:
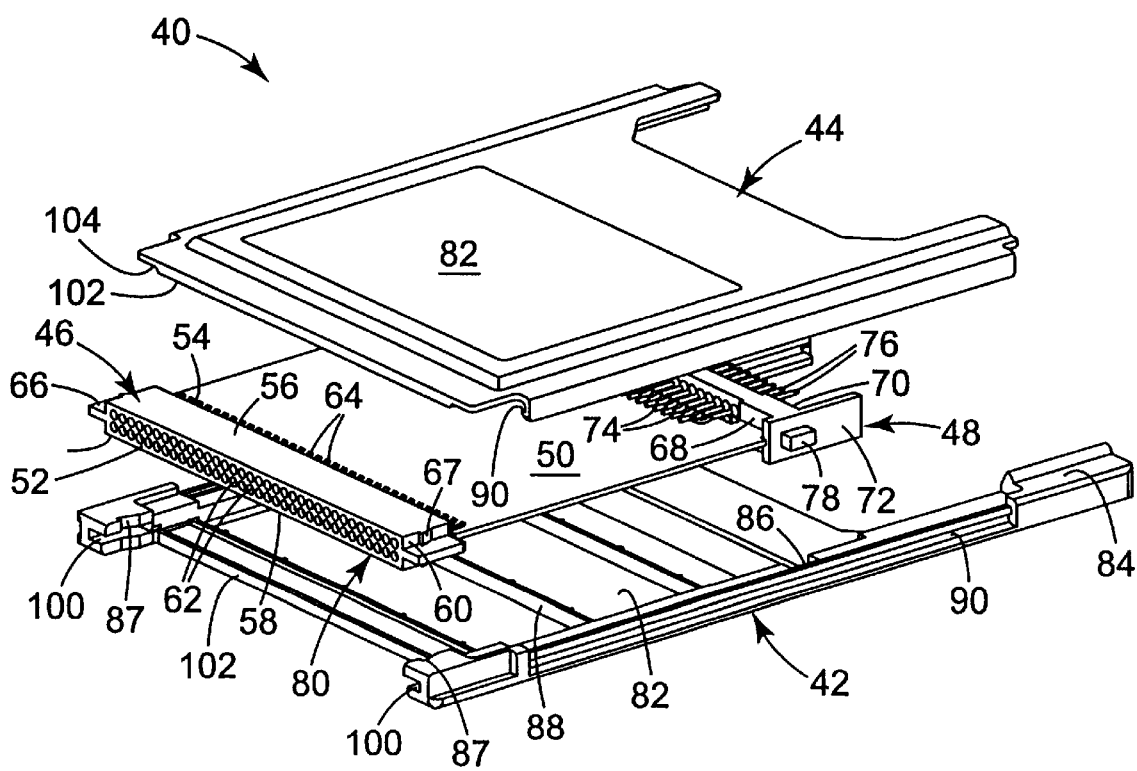
FIG. 4a is an exploded view of the adapter assembly of FIG. 3.

Referring to FIG. 3, illustrated is an isometric view of the inventive IC card adapter assembly 40. The components of adapter assembly 40 are best seen in FIG. 4a, which shows an exploded view of the adapter assembly 40 of FIG. 3. Adapter assembly 40 includes molded lower housing 42 and upper housing 44, both formed of a dielectric material, first connector 46, second connector 48, and circuit board 50. First connector 46 and second connector 48 are adapted to conform, for example, to PCMCIA and CF standards, respectively, while circuit board 50 functions to translate signals from one connector to the other. Of course, first and second connectors 46, 48 may be selected to conform to any other desired standards, depending upon the user's preference.

First connector 46 and second connector 48 are well known in the art. First connector 46 includes a frontal surface 52, a rear surface 54, a pair of spaced apart connector surfaces including an upper surface 56 and a lower surface 58, and opposed side surfaces 60. Frontal surface 52 includes a plurality of pin receiving connections 62, well known in the art, for connection to an external host connector device. Rear surface 54 includes a plurality of solder tails 64 for making electrical contact with circuit board 50. Side surfaces 60 each include a guide rail 66. A latching mechanism 67 is incorporated into side surfaces 60 for securing first connector 46 within the assembly.

Second connector 48 includes a frontal surface 68, a rear surface 70, and opposed side surfaces 72. Frontal surface 68 includes a plurality of solder tails 74 for making electrical contact with circuit board 50. Rear surface 70 includes a plurality of pin connections 76, well known in the art, for connection to an IC card. Side surfaces 72 each include a locking tab 78.

Together, first connector 46, second connector 48 and circuit board 50 form a subassembly 80 which is enclosed by lower housing 42 and upper housing 44.

Figure 4B:
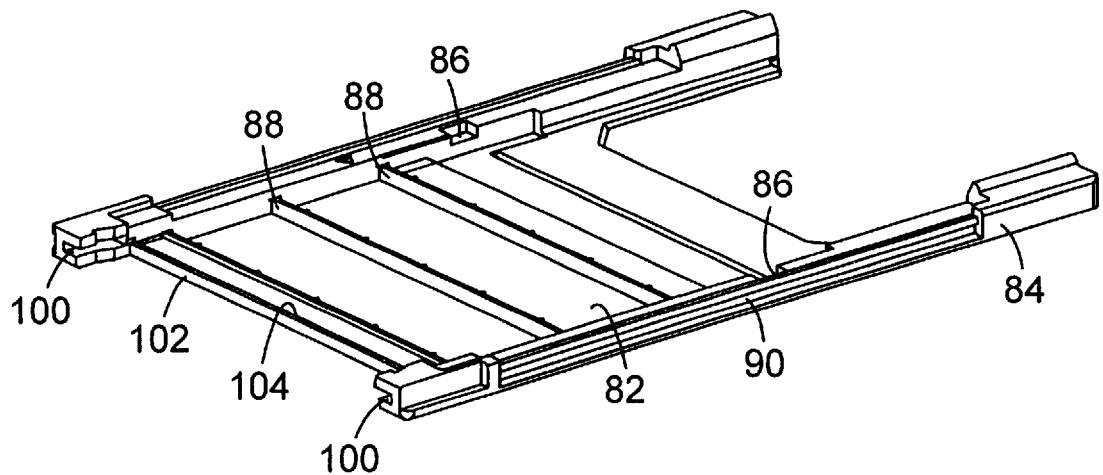

Lower housing 42 (seen unobstructed in FIG. 4b) and upper housing 44 both include thin walls 82 which extend between side rails 84 and serve to protect circuit board 50. As best seen in FIG. 4b, side rails 84 of lower housing 42 include recesses 86, which are sized to capture locking tabs 78 of second connector 48. Side rails 84 also include detents 87 for cooperating with latching mechanisms 67 on first connector 46. When locking tabs 78 of second connector 48 are captured within recesses 86 and latching mechanism 67 of first connector 46 engage detents 87 in side rails 84, the subassembly 80 consisting of first and second connectors 46, 48, respectively, and circuit board 50 is prevented from moving within adapter assembly 40 as adapter assembly 40 is inserted into a host device, or as IC cards are inserted to adapter assembly 40.

Lower housing 42 and upper housing 44 further include ribs 88 which extend across wall 82. Ribs 88 function to stiffen wall 82 so that wall 82 does not give or feel flimsy to the touch. Ribs 88 may be arranged such that they contact circuit board 50 without detrimental effect, thereby imparting additional support to circuit board 50 and wall 82. Preferably, ribs of lower housing 42 and upper housing 44 oppose one another to better support lower and upper housings 42, 44 and circuit board 50. Another benefit of ribs 88 is that they function as flow enhancers during the molding process.

Figure 5:
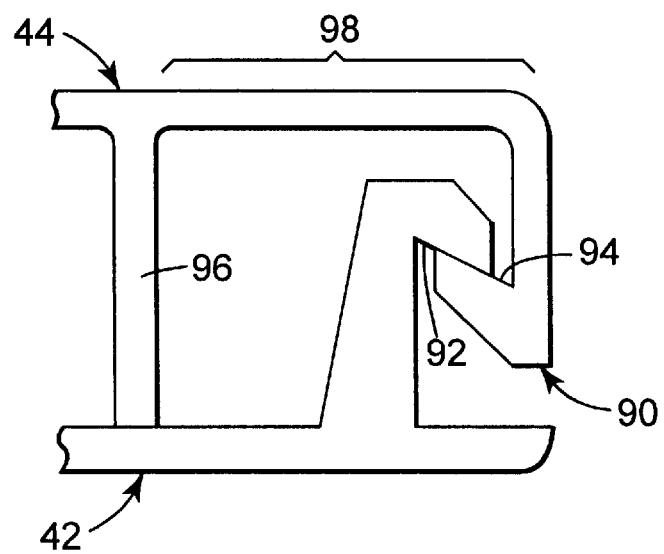
FIG. 5 is a cross sectional view of the latching means of the adapter assembly of FIG. 3.
Figure 6A:
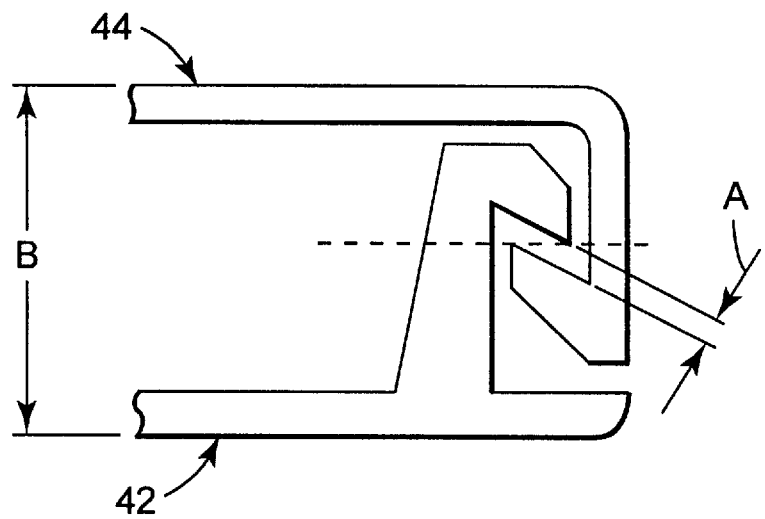
FIGS. 6a and 6b are cross sectional views of latching means which introduce dimensional variance.
Figure 6B:
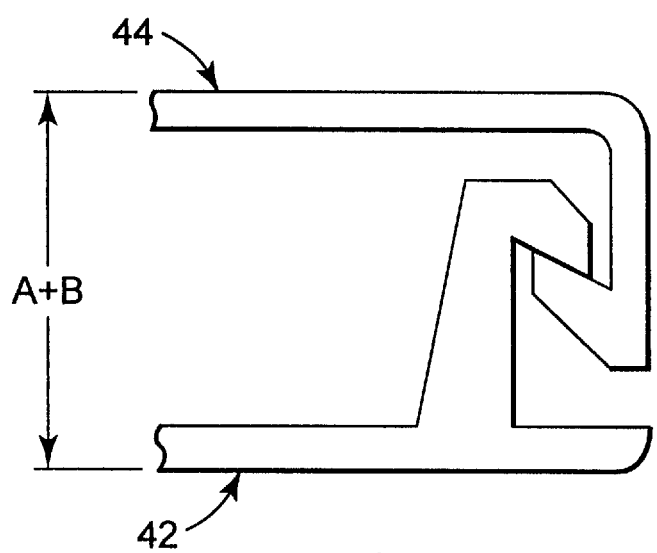

Lower housing 42 and upper housing 44 are secured together by latching means 90 which are integrally molded into the side rails 84 of lower housing 42 and upper housing 44. Latching means 90 extend along the length of side rails 84 and are best seen in cross section in FIG. 5. It should be noted that FIG. 5 is greatly simplified to clearly illustrate the latching means and other structures. To prevent separation of lower housing 42 and upper housing 44, lower housing 42 is provided with angled engaging surface 92, while upper housing 44 is provided with mating angled engaging surface 94 and tensioning member 96. It is common for latches to have such angled engaging surfaces to prevent separation caused by flexure, physical impact, and material creep. However, the angled engaging surfaces 92, 94 usually result in undesired "play" between assembled parts. As illustrated in FIGS. 6a and 6b, if clearance "A" is provided to allow latching of the two members, the resulting assembly thickness will vary, with the thickness ranging from "B" to "A+B". In the case of IC cards or IC adapter assemblies, even small variations in thickness can result in out-of-spec products, which is not acceptable.

The latching means 90 of the present invention overcomes the above described difficulty by providing tensioning member 96 on upper housing 44. Tensioning member 96 is formed so as to contact lower housing 42 and keep angled engaging surfaces 92, 94 in constant contact, such that there is no "play" between lower housing 42 and upper housing 44. Tensioning member 96 effectively creates a cantilever arm 98 on upper housing 44 that may be flexed to latch engaging surfaces 92, 94, but which does not allow any play between the components. Tensioning member 96 must be positioned a suitable distance from engaging surface 94 such that the material of upper housing 44 is not over-stressed when it is flexed to engage the lower and upper housings 42, 44. It is expected that those skilled in the art will recognize a number of possible variations of the latching means of FIG. 5, but which provide the same function. Such variations are contemplated to be within the scope of the present invention.

Integrally molded into side rails 84 of lower housing 42 are channels 100. Channels 100 are sized to slidably receive guide rails 66 of first connector 46. Because first connector 46 is not adhesively bonded to lower housing 42 and upper housing 44, channels 100 aid in aligning and securing first connector 46 within adapter assembly 40. First connector 46 is further secured in lower housing 42 by cooperative engagement of latching mechanism 67 on first connector 46 and detents 87 on side rails 84. If desired, cooperating guide rails 66 and channels 100, as well as latching mechanisms 67 and detents 87, may be made asymmetrical such that the components can engage in only the desired orientation.

Figure 7:
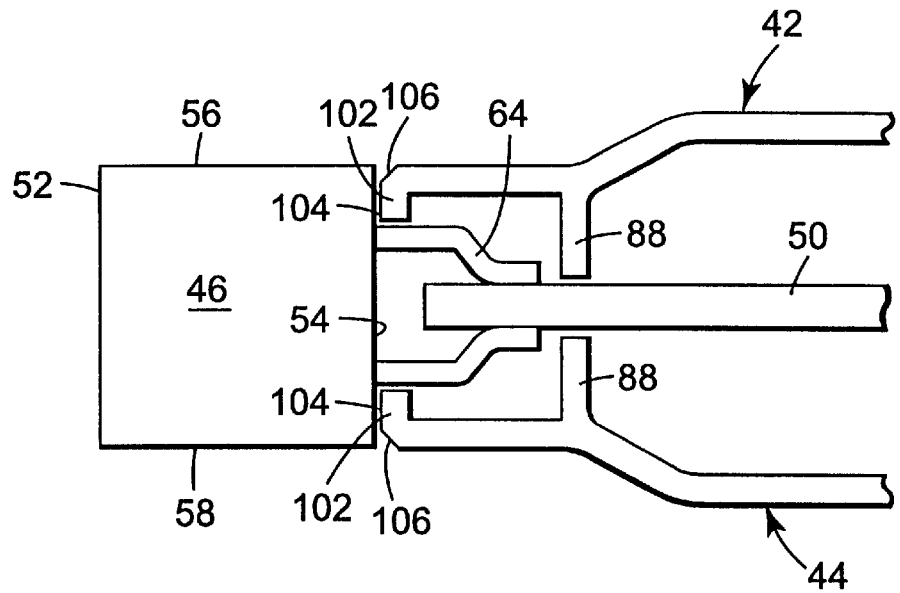
FIG. 7 is a cross sectional view of a portion of the adapter assembly of FIG. 3.

To further aid in securely holding first connector 46 within adapter assembly 40, the portion of lower housing 42 and upper housing 44 which is adjacent first connector 46 is provided with a unique structure. As best seen in FIG. 7, and contrasted to the prior art adapter shown in FIGS. 1 and 2, upper housing 44 and lower housing 42 stop behind the body of first connector 46. It is thus not necessary for lower housing 42 and upper housing 44 to overlap the body of first connector 46, and the previously discussed problems related to the difficulty of molding suitably thin plastic covers are avoided. The body of first connector 46 may thus be the full thickness required by the appropriate standard (such as PCMCIA or CF) and no allowance needs to be made for the thickness of the side walls and adhesive, as in the prior art.

Lower housing 42 and upper housing 44 are provided with a thickened lip 102 which may rest on contacts 64. Lips 102 provides additional support to front edges 104 of lower and upper housings 42, 44 and provide a solid tactile feel. Lip 102 also straightens any inward bow of molded upper and lower housings 42, 44, helps resist warping of lower housing 42 and upper housing 44, and discourages tampering with the assembly by blocking any tools attempting to pry under the housings. A lead-in radius or chamfer 106 is provided adjacent first connector 46, thereby reducing the possibility of lower or upper housing 42, 44, catching on any surface during use. Preferably, ribs 88 which contact circuit board 50 are located as close as possible to front edges 104 to further support and stiffen lower housing 42 and upper housing 44.

To assemble adapter assembly 40, subassembly 80 (consisting of first connector 46, second connector 48, and circuit board 50) is positioned such that guide rails 66 of first connector 46 are aligned with channels 100 in lower housing 42. Guide rails 66 are slid into channels 100 until locking tabs 78 on second connector 48 are captured by recesses 86 of lower housing 42 and latching mechanisms 67 of first connector 46 are engaged with detents 87. Upper housing 44 is then snapped onto lower housing 42 and secured by latching means 90. Cross-sectional views of the assembled adapter assembly 40 are shown in FIGS. 8 and 9, taken along lines 8—8 and 9—9, respectively, of FIG. 3.

Figure 10:
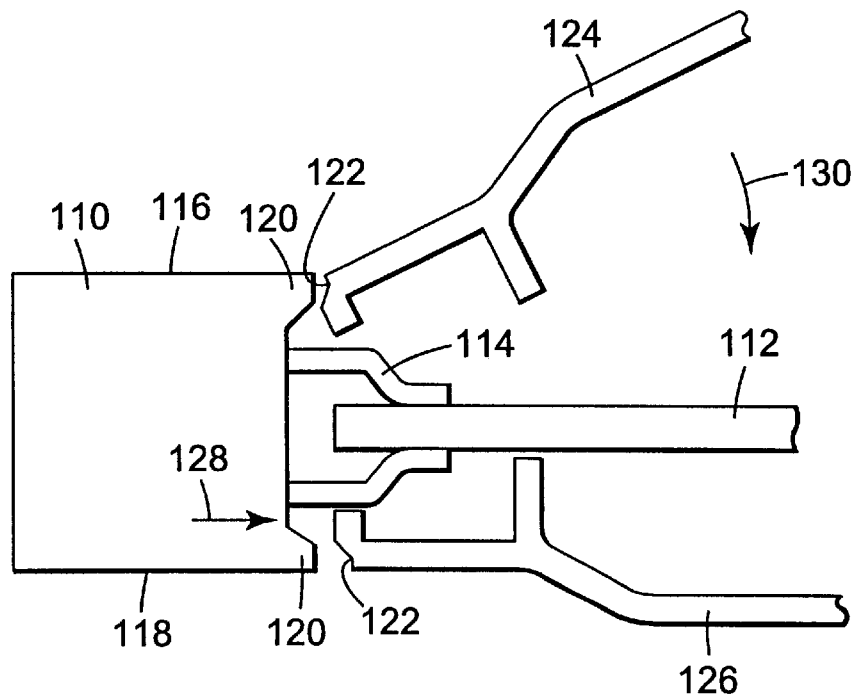
FIG. 10 is a cross sectional view of a portion of an alternative configuration of the adapter assembly.

It will be appreciated by those skilled in the art that variations may be made to the assembly described herein. An alternate connector and housing configuration is shown in FIG. 10. FIG. 10 shows a connector 110 connected to circuit board 112 by solder tails 114. Upper and lower surfaces 116, 118, respectively, of connector 110 are provided with protruding tongues 120 which engage with grooves 122 on upper and lower housings 124, 126, respectively. The engagement of tongues 120 with grooves 122 provides a barrier to debris which could otherwise enter the interior of the assembly, prevents outward bowing of housings 124, 126. To assemble connector 110 and housings 124, 126, connector 110 and circuit board 112 are slidably engaged with lower housing 126 in the direction of arrow 128, as described above with respect to the configuration of FIGS. 1–9. Groove 122 of upper housing 124 is then engaged under mating tongue 120 of connector 110 and upper housing 124 is rotated in the direction of arrow 130 to engage lower housing 126 in the manner described with respect to the configuration of FIGS. 1–9.

The preferred embodiment describes a snap-fitting engagement between the upper and lower housings. However, those skilled in the art will recognize that other types of engagement between upper and lower housings could also work. For example, the upper and lower housings could be secured together by press fitting, ultrasonic welding, or chemical bonding, depending upon the requirements of the user. Such techniques are considered within the scope of the present invention.

Figure 11:
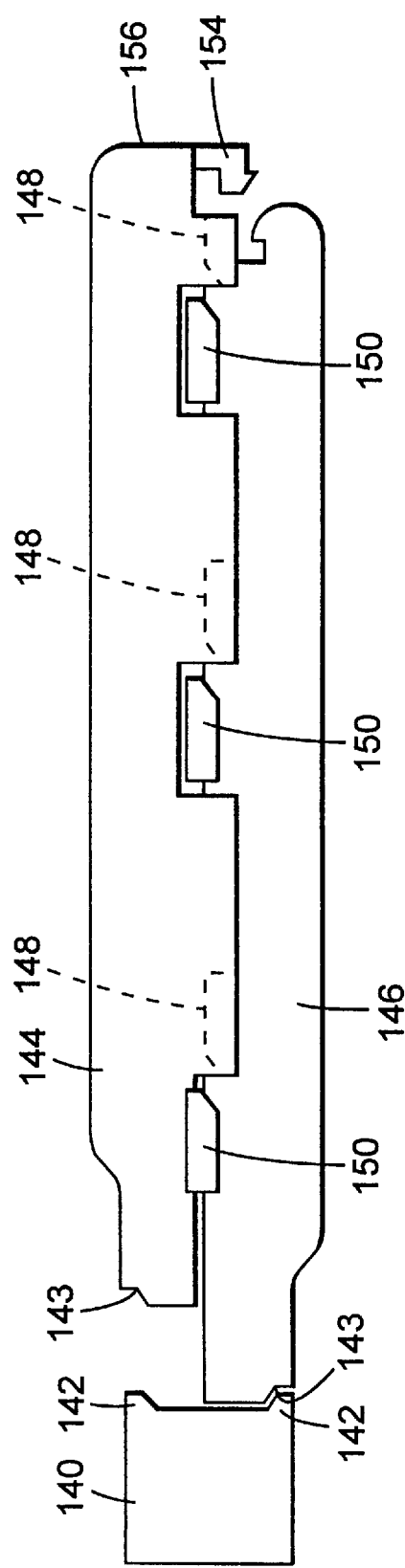
FIG. 11 is a schematic side view of an alternative configuration of the adapter assembly.

An alternate configuration for securing the connector and housings is shown in FIG. 11. A connector 140 is provided with tongues 142 for engaging grooves 143 of upper and lower housings 144, 146. Upper and lower housings 144, 146 are provided with interlock tabs 148, 150, respectively, which are designed for cooperative engagement with each other. After connector 140 and lower housing 146 are engaged with each other in the manner described above, upper housing 144 is positioned relative to lower housing 146 as shown in FIG. 11 and slid axially in the direction of arrow 152. As upper housing 144 approaches connector 140, interlock tabs 148 of upper housing 144 slide under interlock tabs 150 of lower housing 146. At the same time, groove 143 of upper housing 144 engages tongue 142 on connector 140. Upon full engagement of interlock tabs 148, 150, upper and lower housings 144, 146 are locked together. Upper and lower housings 144, 146 may additionally be provided with a latching means 154 at back end 156 of the assembly. Latching means 154 can be configured to interact with and secure a second connector(not shown) within the assembly, or may also extend across back end 156 of the assembly to provide a closed end if no second connector is used. The second connector may be an input/output (I/O) device such as a CF or PCMCIA connector, as described above, or could alternatively be any other type of signal communication device, such as an infrared transceiver or a telephone jack. It should be noted that FIG. 11 is intended to schematically illustrate the interlock tabs 148, 150 of the alternate configuration, and does not show all features of the assembly.

As it can be seen, there are many advantages to the present invention. One advantage is lower manufacturing cost. There is no need for insert molding, and the need for metal cover tooling, stamping, and forming is eliminated.

Another advantage is lower assembly cost. The inventive assembly disclosed herein reduces assembly steps and time. For example, there is no adhesive bonding of covers to connectors, no ultrasonic welding of molded components, no sheet insulator material needed under metal covers to reduce component shorting, and to need for ground contacts between covers and the circuit board.

A further advantage is improved electricals. Dielectric covers, a feature of the device described herein, are known to reduce the incidence of host equipment damage or program execution errors associated with ESD through metal covers. It is also known the EMI emissions from the card can occur when the metal cover acts as an antenna. The antenna effect is reduced by substituting plastic covers, with the best attenuation of EMI occurring with the use of materials with the highest practical dielectric constant.

A still further advantage is improved mechanicals. Under mechanical or thermal stress or shock, vibration or flexure, assemblies can sometimes fail due to fracturing of ultrasonic welds, and adhesive separation. The inventive assembly described herein avoids these assembly methods and thus the associated failures. Another failure mode is caused by movement of the circuit board away from the connector body, taking the soldered contacts with it. In the present invention, the use of molded ribs to support the circuit board and locking mechanisms to prevent movement of the connectors avoid separation of contacts from the connector body. The elimination of metal covers also eliminates the potential for wearing or skiving of the host connector by the typically sharp edges of metal covers. A further advantage gained by eliminating metal covers is weight reduction, which is very important for manufacturers of hand-held portable devices such as digital cameras and palmtop computers. Yet another advantage of the inventive adapter is its ease of distinctive coloration for product differentiation or brand identification.

Although illustrative embodiments of the invention have been shown and described herein, a wide range of modifications, change and substitution is contemplated in the foregoing disclosure and in some instances, some features of the present invention may be employed without a corresponding use of the other features. For example, although the invention has been shown and described in connection with an IC card adapter assembly, many of the features described herein are equally applicable to and useful in IC cards themselves. Accordingly, it is appropriate that the appended claims be construed broadly and in a manner consistent with the scope of the invention.

What is claimed is:

1. An IC card adapter assembly comprising:
    a printed circuit board having a first edge attached to solder tails extending from a back surface of a first connector and an opposing second edge attached to solder tails extending from a front surface of a second connector, wherein the printed circuit board, first connector and second connector form a subassembly, the subassembly including a first keyed interlock surface;
    a lower molded housing adapted to receive the subassembly, the lower housing including a second keyed interlock surface for oriented engagement with the first keyed interlock surface of the subassembly, and a first latching member;
    an upper molded housing having a second latching member adapted for engagement with the first latching member of the lower housing, wherein the engaged lower and upper housings define a cavity enclosing the printed circuit board.

2. The adapter assembly of claim 1, wherein the first and second latching members are adapted for snap-fitting engagement with each other.

3. The adapter assembly of claim 1, wherein the first and second latching members are adapted for press-fitting engagement with each other.

4. The adapter assembly of claim 1, wherein the upper housing and the lower housing are molded of a dielectric material.

5. The adapter assembly of claim 1, wherein the lower housing and the upper housing each include integrally molded side rails.

6. The adapter assembly of claim 5, wherein the first keyed interlock surface comprises a locking tab extending from the second connector, and wherein the second keyed interlock surface comprises a recess in the side rails of the lower housing.

7. The adapter assembly of claim 5, wherein the first keyed interlock surface comprises a guide rail extending from the first connector, and wherein the second keyed interlock surface comprises a channel in the side rails of the lower housing.

8. The adapter assembly of claim 5, wherein the first keyed interlock surface comprises a latching tab extending from the first connector, and wherein the second keyed interlock surface comprises a detent in the side rails of the lower housing.

9. The adapter assembly of claim 5, wherein the first latching member is integrally molded into the side rails of the lower housing and the second latching member is integrally molded into the side rails of the upper housing.

10. The adapter of claim 9, wherein the interacting first and second latching members include an integrally molded tensioning member for removing free play between the lower and upper housings.

11. The adapter assembly of claim 1, wherein the lower housing and the upper housing each have a first end, the first end of the lower housing and the first end of the upper housing abutting the back surface of the first connector.

12. The adapter assembly of claim 11, wherein an outer surface of the lower housing and an outer surface of the upper housing are coplanar with a lower surface and an upper surface, respectively, of the first connector.

13. The adapter assembly of claim 11, wherein the first end of the lower housing and the first end of the upper housings each include a lip.

14. The adapter assembly of claim 13, wherein the lips of the lower and upper housings rest on the solder tails extending from the back of the first connector.

15. The adapter assembly of claim 1, further comprising means for maintaining spacing between the upper and lower housings and opposed surfaces of the printed circuit board.

16. The adapter assembly of claim 15, wherein the means for maintaining spacing includes ribs connected to opposed planar surfaces of the lower and upper housings within the cavity.

17. The adapter assembly of claim 1, wherein the first connector is a PCMCIA connector and the second connector is a CF connector.

18. The adapter assembly of claim 1, wherein the first connector is a CF connector and the second connector is a PCMCIA connector.

19. The adapter assembly of claim 1, wherein the engaged lower and upper housings enclose the printed circuit board and the second connector.

20. An IC card assembly comprising:
- a printed circuit board attached to solder tails extending from a back surface of a first I/O device, wherein the printed circuit board and first I/O device form a subassembly, the subassembly including a first keyed interlock surface;
- a lower molded housing adapted to receive the subassembly, the lower housing including a second keyed interlock surface for oriented engagement with the first keyed interlock surface of the subassembly, and a first latching member;
- an upper molded housing having a second latching member adapted for engagement with the first latching member of the lower housing, wherein the engaged lower and upper housings define a cavity enclosing the printed circuit board.

21. The adapter assembly of claim 20, wherein the first and second latching members are adapted for snap-fitting engagement with each other.

22. The adapter assembly of claim 20, wherein the first and second latching members are adapted for press-fitting engagement with each other.

23. The adapter assembly of claim 20, further comprising a second I/O device.

24. The adapter assembly of claim 23, wherein the second I/O device is a telephone jack.

25. The adapter assembly of claim 23, wherein the second I/O device is an infrared transceiver.

26. The adapter assembly of claim 20, wherein the lower housing and the upper housing each have a first end, the first end of the lower housing and the first end of the upper housing abutting the back surface of the first connector.

27. The adapter assembly of claim 26, wherein an outer surface of the lower housing and an outer surface of the upper housing are coplanar with a lower surface and an upper surface, respectively, of the connector.

28. The adapter assembly of claim 26, wherein the first end of the lower housing and the first end of the upper housings each include a lip which rests on the solder tails extending from the back of the first connector.

\* \* \* \* \*